(12) United States Patent
Cooney et al.

(10) Patent No.: US 10,349,530 B1
(45) Date of Patent: Jul. 9, 2019

(54) PLASTIC FILM/SHEET AS REPLACEMENT FOR TYPICAL CONFORMAL COATINGS

(71) Applicant: HAMILTON SUNDSTRAND CORPORATION, Charlotte, NC (US)

(72) Inventors: Robert C. Cooney, Janesville, WI (US); John Huss, Roscoe, IL (US); Kandy Elaine Spahr, Roscoe, IL (US); Deron J. Staas, Rockford, IL (US); Mark W. Metzler, Davis, IL (US); Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/863,668

(22) Filed: Jan. 5, 2018

(51) Int. Cl.
| H05K 7/00 | (2006.01) |
| H05K 3/28 | (2006.01) |
| H05K 1/18 | (2006.01) |
| H05K 3/00 | (2006.01) |

(52) U.S. Cl.
CPC .............. *H05K 3/285* (2013.01); *H05K 1/181* (2013.01); *H05K 3/0044* (2013.01); *H05K 3/284* (2013.01); *H05K 2201/0108* (2013.01); *H05K 2201/0125* (2013.01); *H05K 2201/0129* (2013.01); *H05K 2203/1333* (2013.01)

(58) Field of Classification Search
CPC ......... H01L 2924/0002; H01L 2924/00; H01L 21/02299; H01L 21/027; H01L 23/564; B05C 21/005; H05K 1/02; H05K 3/0073; H05K 3/28; H05K 3/284; Y10T 29/49002
See application file for complete search history.

(56) References Cited

U.S. PATENT DOCUMENTS

| 4,695,926 A | * | 9/1987 | McDermott | ........... H05K 3/284 |
| | | | | 174/DIG. 8 |
| 9,127,186 B2 | | 9/2015 | Arita et al. | |
| 9,627,194 B2 | | 4/2017 | Stevens et al. | |
| 2008/0138551 A1 | * | 6/2008 | Gordon | .............. G11B 33/0444 |
| | | | | 428/35.7 |
| 2008/0302418 A1 | * | 12/2008 | Buller | ............... H01L 31/02168 |
| | | | | 136/259 |
| 2015/0072452 A1 | * | 3/2015 | Stevens | ..................... H05K 3/28 |
| | | | | 438/26 |
| 2015/0274972 A1 | * | 10/2015 | Mateu | ..................... C08L 75/08 |
| | | | | 424/59 |

FOREIGN PATENT DOCUMENTS

DE 102008058287 6/2010

* cited by examiner

*Primary Examiner* — Yuriy Semenenko
(74) *Attorney, Agent, or Firm* — Snell & Wilmer, L.L.P.

(57) ABSTRACT

A system for protecting electronics includes a printed wiring assembly (PWA) having a surface with at least one electronic component. The system also includes a water resistant film configured to be used as a conformal coating on the PWA and further configured to be placed on the surface of the PWA and to shrink about the at least one electronic component.

18 Claims, 5 Drawing Sheets

PLASTIC FILM/SHEET AS REPLACEMENT FOR TYPICAL CONFORMAL COATINGS

FIELD

The present disclosure is directed to systems and methods for protecting electronics by covering at least a portion of a printed wiring assembly with a film that functions as a conformal coating.

BACKGROUND

Printed wiring assemblies (PWAs) may include multiple electronic components positioned on a surface thereof. A PWA may further include wire traces or other conductors that couple the multiple electronic components together. The PWA may also include solder joints at locations in which the electronic components are coupled to the conductors.

Some PWAs may be used in locations in which they may be exposed to moisture. Many electronics and conductors may be damaged by moisture, so it may be desirable to protect the PWA and associated components from being exposed to such moisture.

SUMMARY

Described herein is a system for protecting electronics. The system includes a printed wiring assembly (PWA) having a surface with at least one electronic component. The system also includes a water resistant film configured to be used as a conformal coating on the PWA and further configured to be placed on the surface of the PWA and to shrink about the at least one electronic component.

In any of the foregoing embodiments, the film may be capable of holding an electric charge (such as a very low level electric charge) to facilitate a static cling of the film to the PWA to resist movement of the film relative to the PWA prior to shrinking.

Any of the foregoing embodiments may also include an adhesive configured to be positioned between the film and the PWA to resist movement of the film relative to the PWA prior to shrinking.

In any of the foregoing embodiments, the adhesive includes at least one of acrylic or polyamide.

In any of the foregoing embodiments, the film is provided as multiple strips configured to be positioned adjacent to each other on the PWA prior to shrinking.

In any of the foregoing embodiments, the film is transparent or semi-transparent to facilitate viewing of the at least one electronic component in response to the film being coupled to the PWA.

In any of the foregoing embodiments, the film operates as an electrical insulator.

In any of the foregoing embodiments, the film is sufficiently flexible to surround and contact all exposed surfaces of the at least one electronic component in response to the film being coupled to the PWA.

In any of the foregoing embodiments, the film is configured to shrink in response to being heated to or above a selected temperature.

In any of the foregoing embodiments, the film has a thickness between 1 thousandth of an inch (0.025 millimeters) and 10 thousandths of an inch (0.25 millimeters). It is desirable to minimize the thickness of the film in order to reduce thermal resistance between the PWA and any ambient cooling fluid.

In any of the foregoing embodiments, the film is cut to a desired shape to contact the PWA at locations in which the conformal coating is desired and to avoid contacting the PWA at other locations.

In any of the foregoing embodiments, the film includes a thermoplastic.

In any of the foregoing embodiments, the film is provided as a single sheet sufficiently large to contact the PWA at all locations in which the conformal coating is desired.

Also disclosed is a system for protecting electronics. The system includes a printed wiring assembly (PWA) having a surface with at least one electronic component. The system also includes a water resistant film for use as a conformal coating for the PWA and coupled to the surface of the PWA via heat-shrinking the film about the PWA to reduce a likelihood of water damage to the PWA.

In any of the foregoing embodiments, the film is transparent or semi-transparent to facilitate viewing of the at least one electronic component in response to the film being coupled to the PWA and operates as an electrical insulator.

In any of the foregoing embodiments, the film has a thickness between 1 thousandth of an inch (0.025 millimeters) and 10 thousandths of an inch (0.25 millimeters).

Also disclosed is a method for protecting electronics. The method includes placing a water resistant film over at least one electronic component on a surface of a printed wiring assembly (PWA). The method also includes shrinking the film about the PWA to couple the film to the at least one electronic component Any of the foregoing embodiments may also include cutting the film to a desired shape before placing the film over the surface of the PWA such that the film contacts the PWA at locations in which conformal coating is desired and avoids contacting the PWA at other locations.

Any of the foregoing embodiments may also include fastening the film to the surface via an adhesive, wherein shrinking the film about the PWA includes heating the film.

In any of the foregoing embodiments, the film includes at least one of polyvinylidene fluoride, flexible crosslinked polyolefin, flexible fluoroelastomer, or polyether ether ketone (PEEK).

In any of the foregoing embodiments, the film is sufficiently flexible to surround and contact all exposed surfaces of the at least one electronic component in response to the film being coupled to the PWA. It is desirable for the coefficient of thermal expansion of the film to match that of the PWA over operational range of temperatures, such as between negative 40 degrees C. and 110 degrees C.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1A:
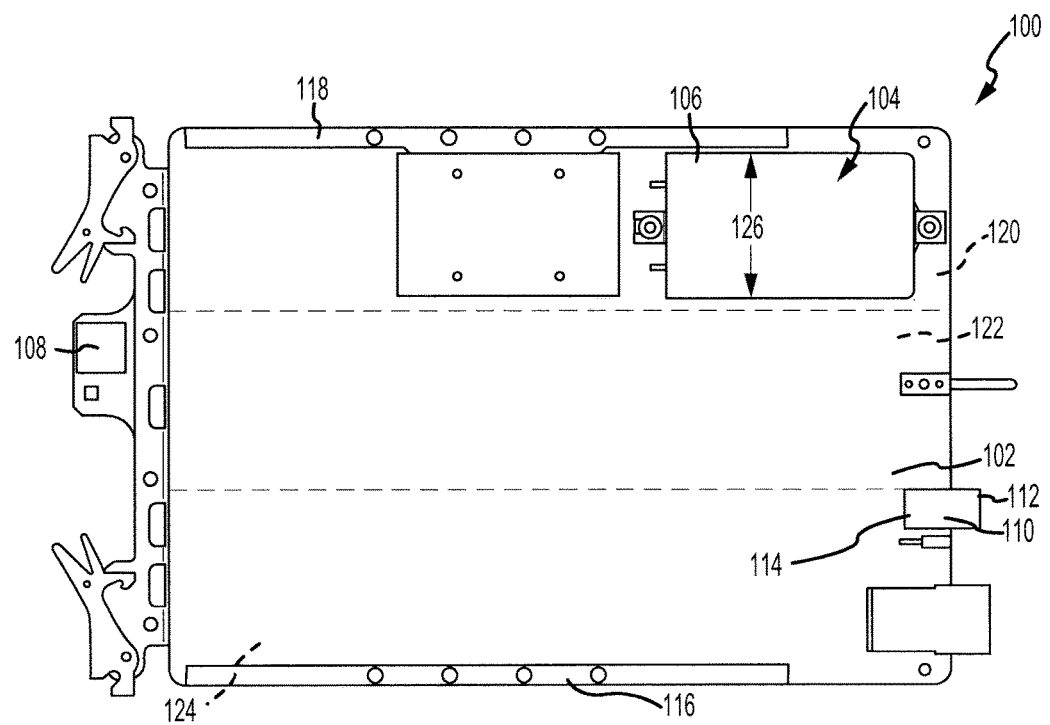
FIG. 1A illustrates a top-down view of a printed wiring assembly (PWA), in accordance with various embodiments of the present disclosure.
Figure 1B:
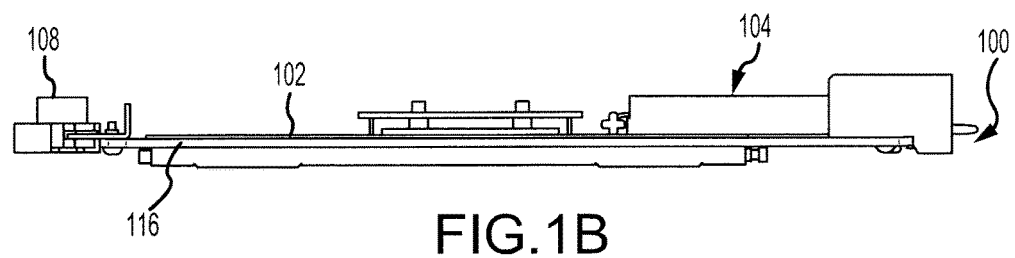
FIG. 1B illustrates a side view of the PWA of FIG. 1A, in accordance with various embodiments of the present disclosure.

Referring to FIGS. 1A and 1B, a printed wiring assembly (PWA) 100 includes a surface 102 with at least one exposed electronic component 104 positioned thereon. For example, the PWA 100 may include a power component 106, a first connector 108, and a second connector 110. The second connector 110 may include a first portion 112 and a second portion 114. The PWA 100 may further include a first guide rail 116 and a second guide rail 118. The PWA 100 may include printed traces or other conductors that connect one or more of the electronic components together, along with solder joints that connect the electronic components 104 to the printed traces or other conductors. In various embodiments, the printed traces may be located on the surface 102.

Figure 2A:
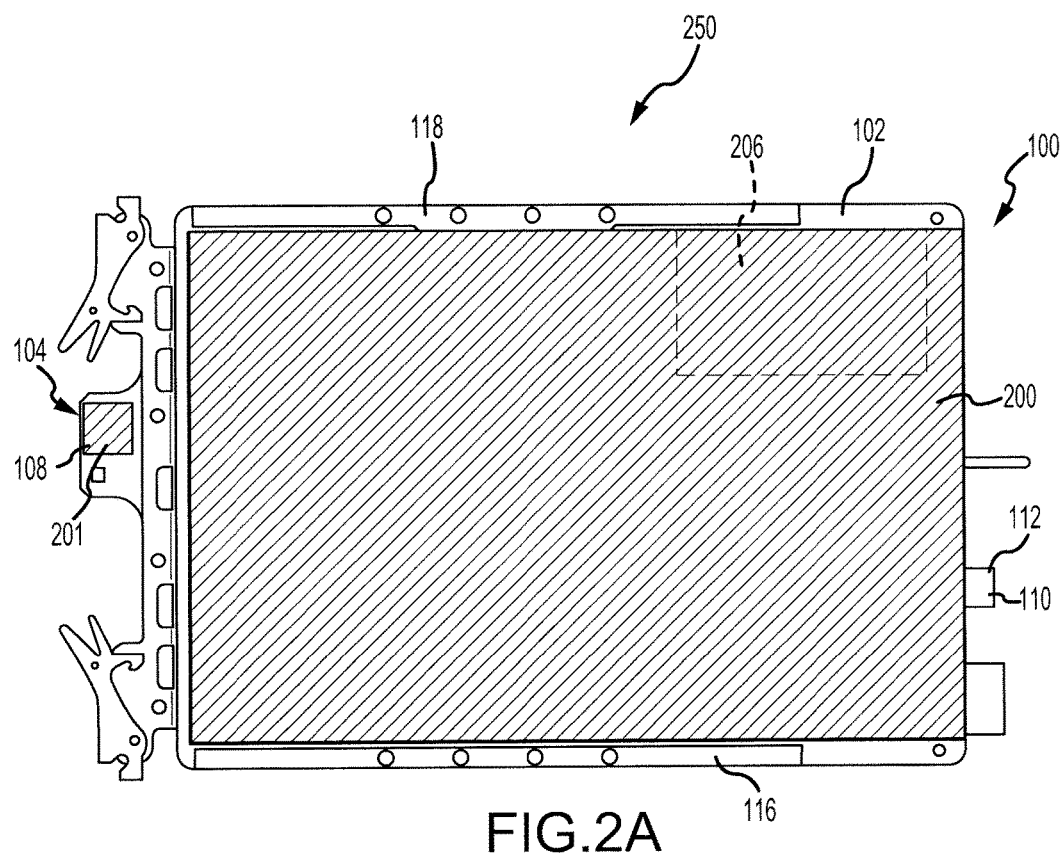
FIG. 2A illustrates a top-down view of a system for protecting the PWA of FIG. 1 including a film to be coupled to the PWA, in accordance with various embodiments of the present disclosure.
Figure 2B:
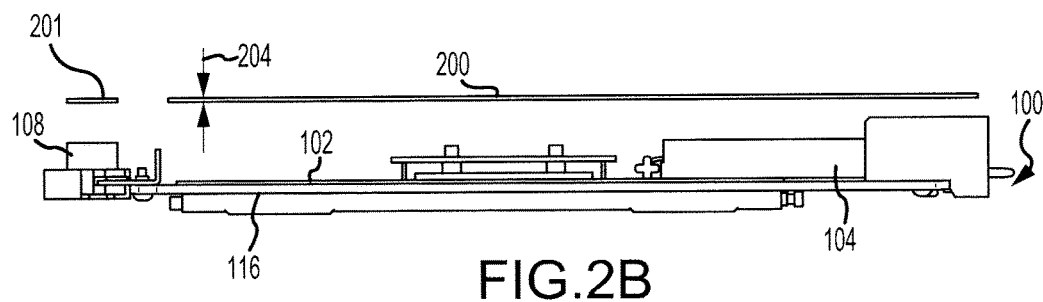
FIG. 2B illustrates a side view of the system of FIG. 2A, in accordance with various embodiments of the present disclosure.

Because the PWA 100 includes electronic devices and electronic connectors (i.e., traces and solder joints), it may be desirable to protect the surface 102 of the PWA 100, along with a portion of the at least one exposed electronic component 104, from water exposure. In that regard and referring to FIGS. 2A and 2B, a system 250 for protecting electronics includes the PWA 100 and a film 200 designed to be coupled to the PWA 100. In particular, the film 200 may be positioned on the surface 102 and may cover a portion of or all the at least one exposed electronic component 104.

The film 200 may include water resistant properties such that the film 200 reduces the likelihood of water contacting the portions of the PWA 100 that are covered by the film 200 in response to the film 200 being coupled to the PWA 100. In that regard, the film 200 may function as a conformal coating to form a barrier to reduce the likelihood of ingress of moisture to the electronic components 104, the traces, and the solder joints of the PWA 100.

It may be desirable for the PWA 100 to be relatively dry prior to being coupled to the film 200. This is because moisture on the surface 102 of the PWA 100 may become trapped between the PWA 100 and the film 200. In that regard, it may be desirable for the PWA 100 to be at least one of stored in a dry box, subjected to a vacuum, or subjected to purging of moisture from the PWA 100, such as via purging with dry nitrogen prior to the film 200 being coupled thereto.

In various embodiments, the film 200 may include a thermoplastic. For example, the film 200 may include at least one of polyvinylidene fluoride, flexible crosslinked polyolefin, flexible fluoroelastomer, or polyether ether ketone (PEEK).

In various embodiments, it may be desirable for the film 200 to be sufficiently flexible to surround and contact all exposed surfaces of the electronic components 104 in response to the film 200 being coupled to the PWA 1'00. It may also be desirable for the coefficient of thermal expansion of the film to match that of the PWA over operational range of temperatures, such as between negative 40 degrees C. and 110 degrees C.

The film 200 may have a thickness 204. In various embodiments, the thickness 204 may be between 0.1 thousandths of an inch (0.1 mils, 0.0025 millimeters (0.0025 mm)) and 50 mils (1.27 mm), between 0.5 mils (0.13 mm) and 25 mils (0.64 mm), or between 1 mil (0.025 mm) and 10 mils (0.25 mm). It is desirable to minimize the thickness 204 of the film in order to reduce thermal resistance between the PWA 100 and any ambient cooling fluid.

In particular and referring to FIGS. 1A, 1B, 2A, and 2B, it may be desirable to cover the entire power component 106, the entire first connector 108, and the second portion 114 of the second connector 110 with the film 200. It may be desirable to leave the first portion 112 of the second connector 110 exposed, along with the first guide rail 116 and the second guide rail 118. In that regard, the film 200 may be cut to a desired shape in order to contact or cover the PWA 100 at locations in which a conformal coating is desired, and to avoid contacting the PWA 100 at other locations. In particular, the film 200 may be cut in such a way as to cover the power component 106, the desirable portion of the surface 102, and the second portion 114 of the second connector 110. Additionally, a second piece of film 201 may be cut in such a way as to cover the first connector 108.

Figure 3A:
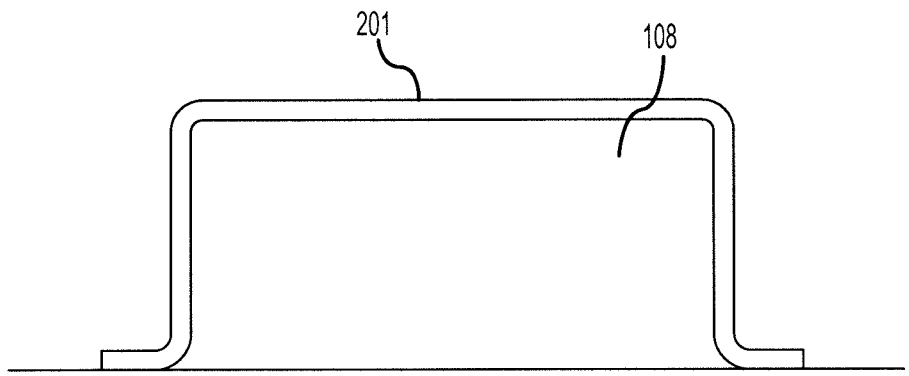
FIG. 3A illustrates an electronic component and the film of FIGS. 2A and 2B prior to coupling the film to the electronic component, in accordance with various embodiments of the present disclosure.
Figure 3B:
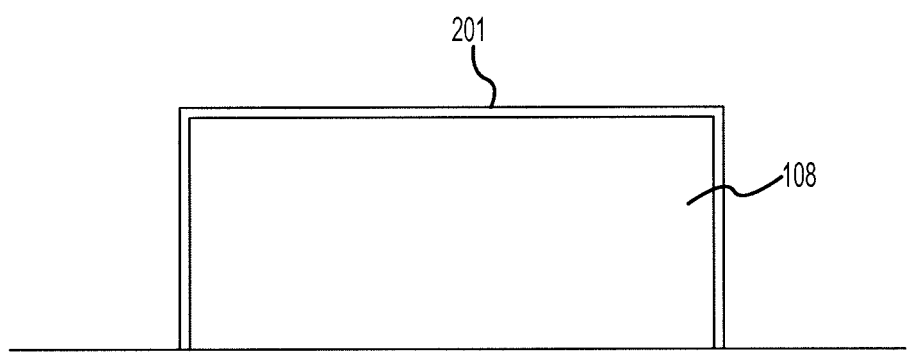
FIG. 3B illustrates the electronic component and the film of FIG. 3A after heating the film to cause the film to shrink about the electronic component, in accordance with various embodiments of the present disclosure.

The film 200 may be designed to shrink around the PWA 100 in order to couple the film 200 to the PWA 100. For example and referring to FIG. 3A, the film 201 may be provided in a size that is greater than the surface area of the first connector 108 prior to heating the film 201. After being positioned about the first connector 108, the film 201 may be heated. Turning to FIG. 3B and as the film 201 is heated, the film 201 may shrink to match the surface area of the first connector 108. In response to the film 201 being shrunk about the first connector 108, the film 201 may be coupled to the first connector 108.

In various embodiments, it may be desirable for the material of the film 201 to be bondable to the PWA 100. For example, it may be desirable for the material of the film 201 to facilitate bonding of the film 201 to the PWA 100, such as in response to heat being applied to the film 201, an adhesive being applied between the film 201 and the PWA 100, or the like.

In various embodiments, the film 201 may be designed to shrink in response to being heated to or above a predetermined or selected temperature. In various embodiments, the predetermined or selected temperature may be between 150 degrees Fahrenheit (150 degrees F., 65.6 degrees Celsius (65.6 degrees C.)) and 700 degrees F. (371 degrees C.), between 150 degrees F. (65.6 degrees C.) and 500 degrees C. (260 degrees C.), or between 200 degrees F. (93 degrees C.) and 400 degrees F. (204 degrees C.).

In various embodiments and returning reference to FIGS. 2A and 2B, it may be desirable for a user to view the components of the PWA 100 after the film 200 has been coupled to the PWA 100. In that regard, the film 200 may be transparent or semi-transparent (such as translucent) to facilitate viewing of the components of the PWA 100.

In various embodiments, one or more of the exposed electronic components 104 of the PWA 100 may occasionally fail. For example and referring to FIGS. 1A, 1B, 2A, and 2B, the power component 106 may fail after significant use. A user of the PWA 100 may view the power component 106 through the transparent or semi-transparent film 200 to identify that the power component 106 has failed. The user may then cut out a portion 206 of the film 200 to replace the power component 106. The user may then couple a new piece of film to the area of the PWA 100 exposed by removal of the portion 206 to cover the replacement power component 106. The new piece of film may be coupled to the area of the PWA 100 via heat shrinking, an adhesive, or the like. In various embodiments, a liquid conformal coating may be used to patch the area of the PWA 100 that is exposed by removal of the portion 206 instead of, or in addition to, coupling the new piece of film to the area exposed by removal of the portion 206.

Because the film 200 may contact more than one electronic component 104, it may be desirable for the film 200 to be nonconductive. In that regard, the material of the film 200 may function or operate as an electrical insulator and may thus be nonconductive.

In various embodiments, one or more of the exposed electronic components 104 may extend away from the surface 102. In that regard, the film 200 may have sufficient flexibility to surround and contact all exposed surfaces of the exposed electronic components 104 that are to be covered with the film 200.

In various embodiments, it may be desirable to cause the film 200 to remain in place relative to the PWA 100 prior to shrinking the film 200 about the PWA 100. In that regard, the film 200 may be capable of holding an electric charge to facilitate a static cling of the film 200 to the PWA 100. A user may place the film 200 with a static charge in the desirable location on the surface 102. The static charge of the film 200 may cause the film 200 to remain in place relative to the PWA 100 during any transport of the system 250 and prior to or during heating of the film 200.

Figure 4:
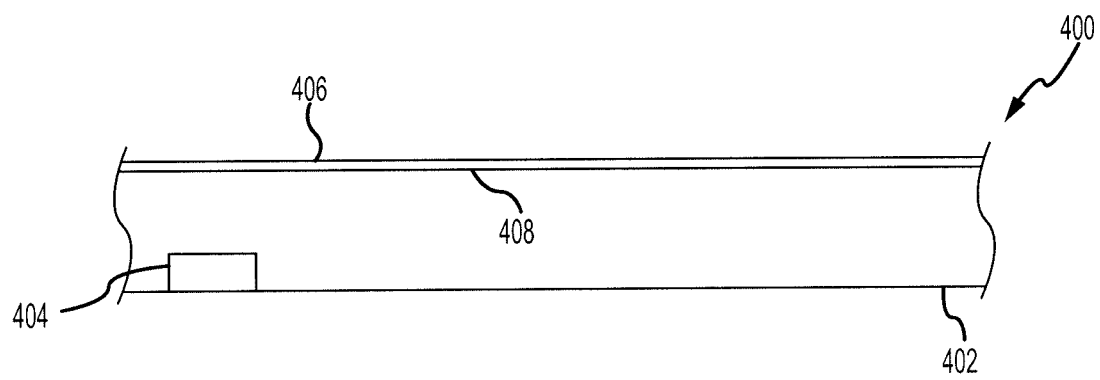
FIG. 4 illustrates a system for protecting an electronic component and includes a PWA, a film, and an adhesive used to couple the film to the PWA, in accordance with various embodiments of the present disclosure.

In various embodiments and referring to FIG. 4, a system 400 for protecting electronics may include a PWA 402 having one or more electronic component 404. The system 400 may further include a film 406. Unlike the film 200 of FIGS. 2A and 2B, the film 406 may fail to include a static charge. In that regard, an adhesive 408 may be located between the film 406 and the PWA 402. The adhesive 408 may resist movement of the film 406 relative to the PWA 402 prior to shrinking of the film 406. In various embodiments, the adhesive 408 may include at least one of acrylic or polyamide.

Figure 5:
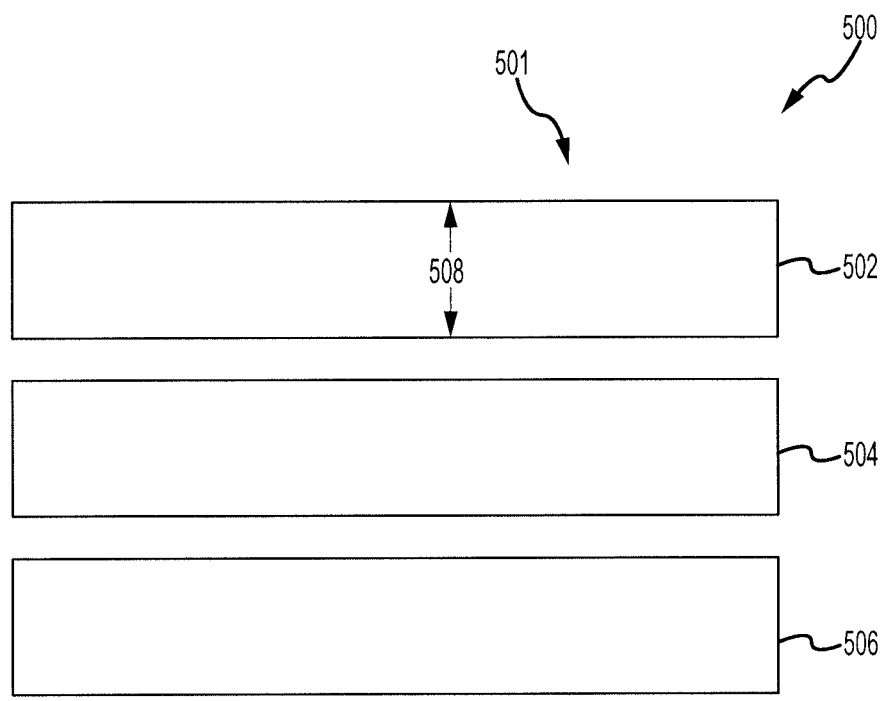
FIG. 5 illustrates a film for use in protecting a PWA that includes multiple strips, in accordance with various embodiments of the present disclosure.

In various embodiments and referring to FIGS. 1A and 5, a film 500 may be provided as multiple strips 501. Each of the multiple strips 501 may be placed adjacent to each other on the surface 102 of the PWA 100. For example, a first strip 502 may be positioned on a first portion 120 of the surface 102, a second strip 504 may be positioned on a second portion 122 of the surface 102, and a third strip 506 may be positioned on a third portion 124 of the surface 102.

In various embodiments, one or more of the multiple strips 501 may have a width that corresponds to a width of an electronic component on which the film 500 will be positioned. For example, the first strip 502 may have a width 508. The width 508 may be similar to, or the same as, a width 126 of the power component 106. In that regard, use of the multiple strips 501 may increase the ease of positioning the film 500 around outer surfaces of the exposed electronic components 104.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for protecting electronics, comprising:
  a printed wiring assembly (PWA) having a surface with at least one electronic component; and
  a water resistant film separate from the PWA, being cut to a desired shape to contact the PWA at locations in which a conformal coating is desired and to avoid contacting the PWA at other locations, providing the conformal coating on the PWA, located on the surface of the PWA, and shrunk about the at least one electronic component and the PWA to couple the water resistant film to the at least one electronic component and the PWA.

2. The system of claim 1 wherein the film is capable of holding an electric charge to facilitate a static cling of the film to the PWA to resist movement of the film relative to the PWA prior to shrinking.

3. The system of claim 1, further comprising an adhesive positioned between the film and the PWA to resist movement of the film relative to the PWA prior to shrinking of the film.

4. The system of claim 3, wherein the adhesive includes at least one of acrylic or polyamide.

5. The system of claim 1, wherein the film is provided as multiple strips configured to be positioned adjacent to each other on the PWA prior to shrinking.

6. The system of claim 1, wherein the film is transparent or semi-transparent to facilitate viewing of the at least one electronic component in response to the film being coupled to the PWA.

7. The system of claim 1, wherein the film operates as an electrical insulator.

8. The system of claim 1, wherein the film is sufficiently flexible to surround and contact all exposed surfaces of the at least one electronic component in response to the film being shrunk.

9. The system of claim 1, wherein the film is shrunk by being heated to or above a selected temperature.

10. The system of claim 1, wherein the film has a thickness between 1 thousandth of an inch (0.025 millimeters) and 10 thousandths of an inch (0.25 millimeters).

11. The system of claim 1, wherein the film includes a thermoplastic.

12. The system of claim 1, wherein the film is provided as a single sheet sufficiently large to contact the PWA at all locations in which the conformal coating is desired.

13. A system for protecting electronics, comprising:
  a printed wiring assembly (PWA) having a surface with at least one electronic component; and
  a water resistant film separate from the PWA, being cut to a desired shape to contact the PWA at locations in which a conformal coating is desired and to avoid contacting the PWA at other locations, providing the conformal coating for the PWA, and coupled to the surface of the PWA via heat-shrinking the film about the PWA to reduce a likelihood of water damage to the PWA.

14. The system of claim 13, wherein the film is transparent or semi-transparent to facilitate viewing of the at least one electronic component in response to the film being coupled to the PWA and operates as an electrical insulator.

15. A method for protecting electronics, comprising:
  placing a water resistant film over at least one electronic component on a surface of a printed wiring assembly (PWA);
  cutting the film to a desired shape before placing the film over the surface of the PWA such that the film contacts the PWA at locations in which conformal coating is desired and avoids contacting the PWA at other locations; and
  shrinking the film about the PWA to couple the film to the at least one electronic component.

16. The method of claim 15, further comprising fastening the film to the surface via an adhesive, wherein shrinking the film about the PWA includes heating the film.

17. The method of claim 15, wherein the film includes at least one of polyvinylidene fluoride, flexible crosslinked polyolefin, flexible fluoroelastomer, or polyether ether ketone (PEEK).

18. The method of claim 15, wherein the film is sufficiently flexible to surround and contact all exposed surfaces of the at least one electronic component in response to the film being coupled to the PWA.

* * * * *